United States Patent
Beach

(10) Patent No.: US 7,807,540 B2
(45) Date of Patent: Oct. 5, 2010

(54) BACK END THIN FILM CAPACITOR HAVING PLATES AT THIN FILM RESISTOR AND FIRST METALLIZATION LAYER LEVELS

(75) Inventor: Eric W. Beach, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/711,118

(22) Filed: Feb. 23, 2010

(65) Prior Publication Data

US 2010/0151651 A1 Jun. 17, 2010

Related U.S. Application Data

(62) Division of application No. 11/340,385, filed on Jan. 26, 2006, now Pat. No. 7,696,603.

(51) Int. Cl.
*H01L 21/20* (2006.01)

(52) U.S. Cl. .................. 438/381; 257/E21.008

(58) Field of Classification Search ........... 438/381; 257/E21.008
See application file for complete search history.

(56) References Cited

U.S. PATENT DOCUMENTS

| | | | |
|---|---|---|---|
| 4,019,168 | A | 4/1977 | Collins |
| 5,624,864 | A | 4/1997 | Arita et al. |
| 5,813,664 | A | 9/1998 | Pan |
| 5,874,770 | A | 2/1999 | Saia et al. |
| 6,140,693 | A | 10/2000 | Weng et al. |
| 6,890,810 | B2 | 5/2005 | Amadon et al. |
| 2005/0082639 | A1 | 4/2005 | Kikuta et al. |
| 2007/0121274 | A1 | 5/2007 | Talvacchio et al. |

*Primary Examiner*—Lex Malsawma
(74) *Attorney, Agent, or Firm*—Warren L. Franz; Wade J. Brady, III; Frederick J. Telecky, Jr.

(57) ABSTRACT

An integrated circuit back end capacitor structure includes a first dielectric layer on a substrate, a thin film bottom plate on the first dielectric layer, and a second dielectric layer on the first dielectric layer and the bottom plate, and a thin film top plate disposed on the second dielectric layer. The thin film top plate and bottom plate are composed of thin film resistive layers, such as sichrome, which also are utilized to form back end thin film resistors having various properties. Interconnect conductors of a metallization layer contact the top and bottom plates through corresponding vias.

20 Claims, 8 Drawing Sheets

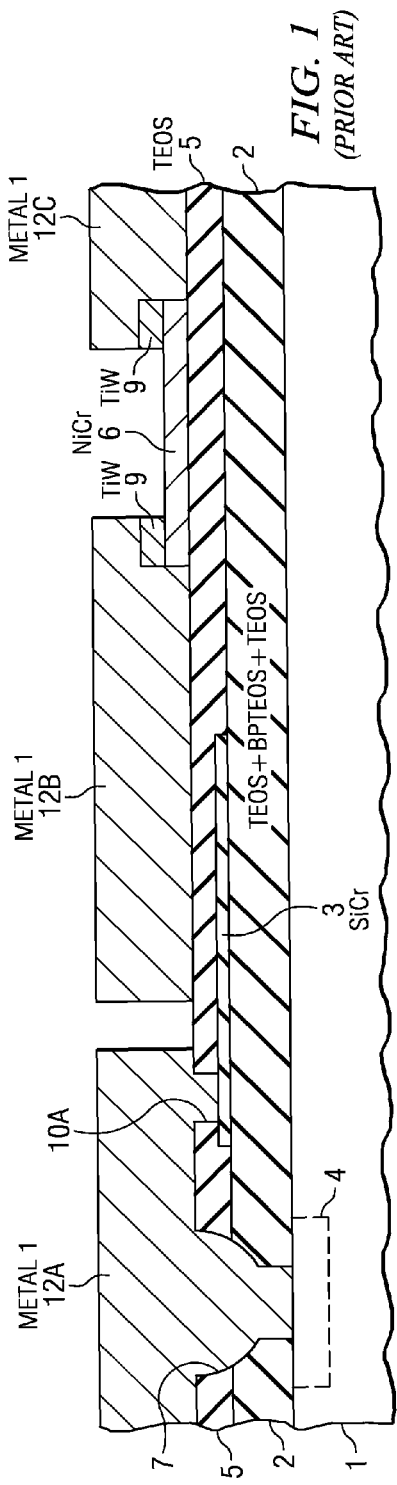
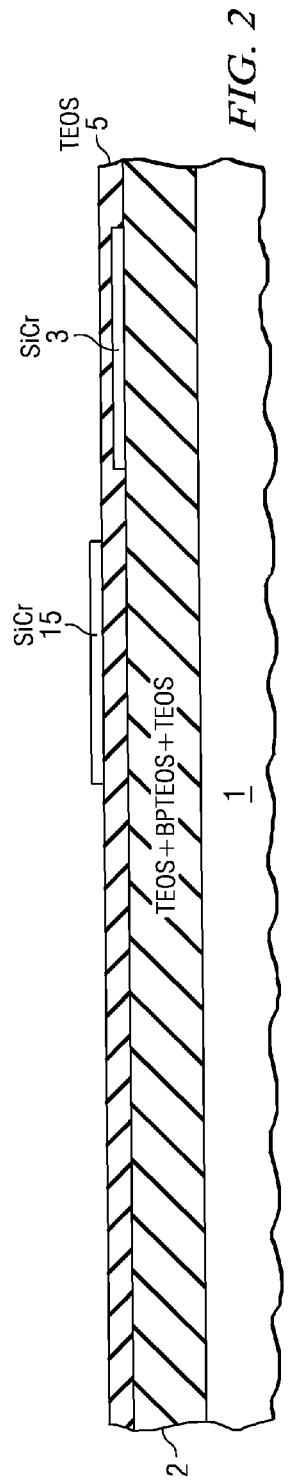
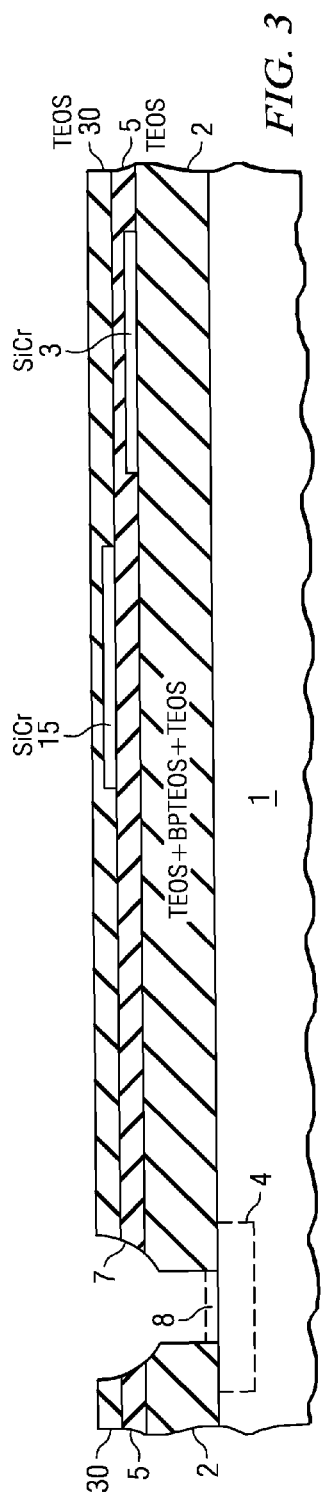
*FIG. 1* (PRIOR ART)
*FIG. 2*
*FIG. 3*

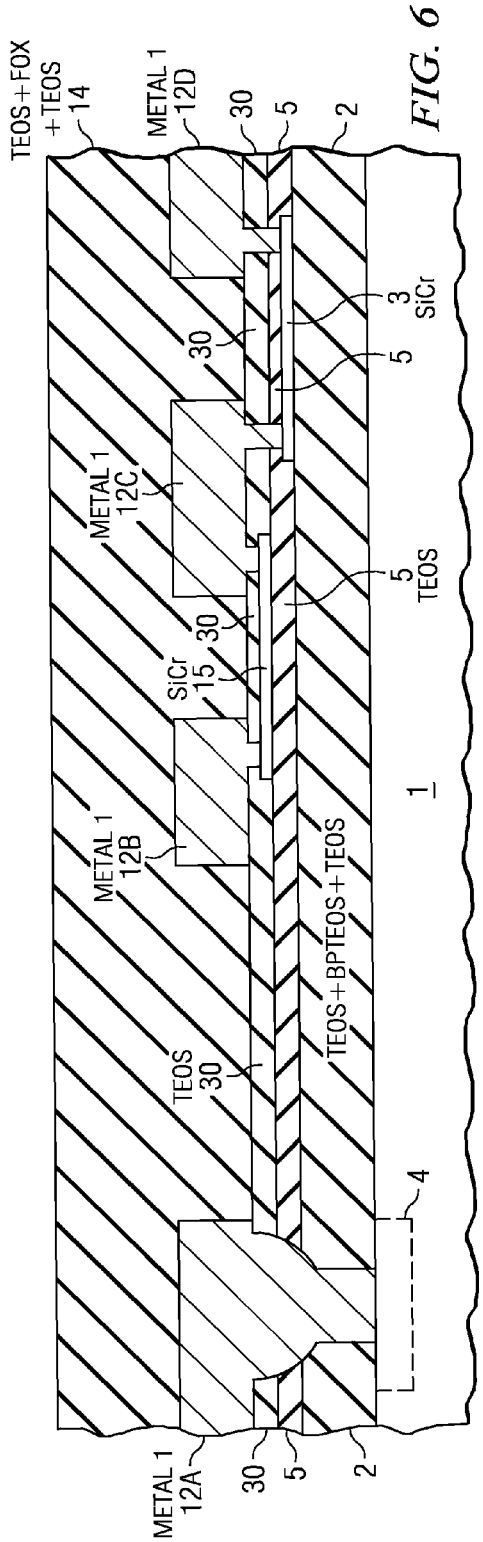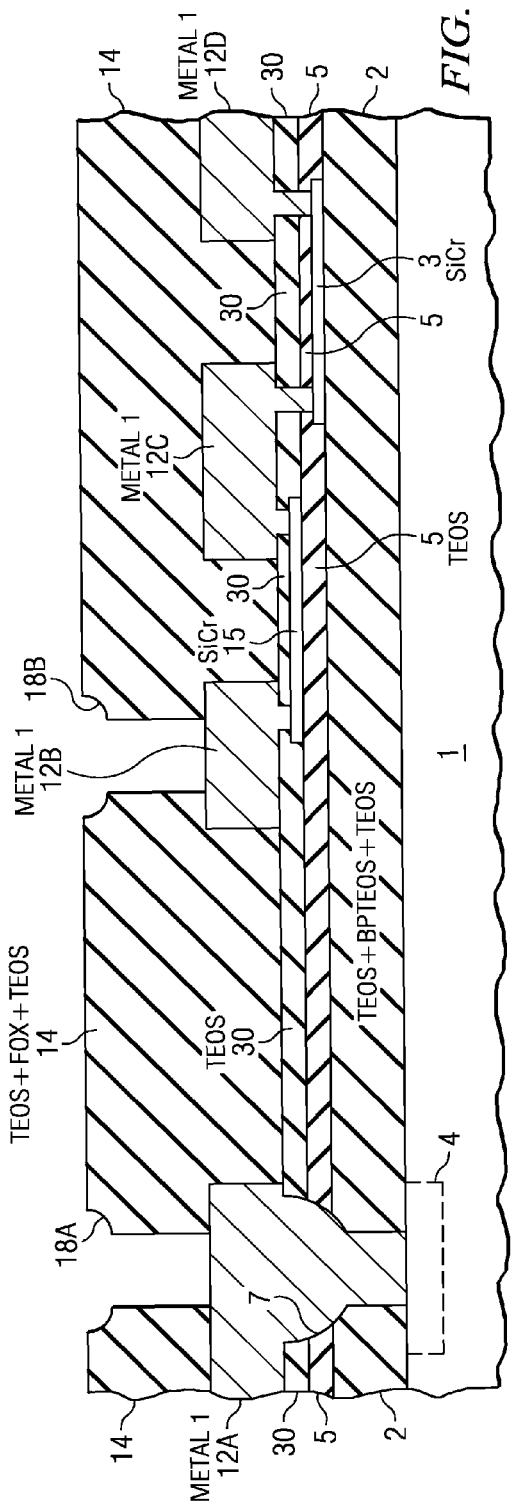

BACK END THIN FILM CAPACITOR HAVING PLATES AT THIN FILM RESISTOR AND FIRST METALLIZATION LAYER LEVELS

This is a division of U.S. application Ser. No. 11/340,385, filed Jan. 26, 2006, the entirety of which is incorporated herein by reference.

BACKGROUND

The present invention relates generally to practical "back end" thin film capacitor structures and methods, and also to integrating such back end thin film capacitors into processes and methods for making "back end" thin film resistors. (The term "back end" is used herein to describe integration of components, including thin film capacitors and back end thin film resistors, onto a partially fabricated integrated circuit structure after transistors and polycrystalline silicon structures have already been formed therein. So-called "front end" processes typically include steps performed at a temperatures of 600 to 700 degrees Centigrade, whereas at the present state-of-the-art, "back end" processes typically include only steps performed at temperatures less than roughly 450 degrees Centigrade.)

FIG. 1 shows a prior art structure in which various transistors have been formed, using conventional techniques, in a region 4 of a starting silicon substrate 1. A standard pre-metal dielectric layer 2 formed on silicon substrate 1 includes a first TEOS (tetraethyl orthosilicate) sublayer on the silicon substrate 1, a BPTEOS (Boron-Phosphorus TEOS) sublayer on the first TEOS sublayer, and a second TEOS sublayer on the BPTEOS sublayer. A thin layer 3 of sichrome (SiCr), having a sheet resistance typically in the range from 30 to 2000 ohms per square (based on previously developed curves of TCR versus sheet resistance for the particular SiCr deposition process) has been deposited on the upper surface of pre-metal dielectric layer 2. A conventional photoresist deposition, etching, and cleaning process has been performed to define the shape of SiCr resistor 3. A standard TEOS barrier layer 5 is formed on the upper surfaces of pre-metal dielectric layer 2 and SiCr resistor layer 3. A thin layer 6 of nichrome (NiCr) having a sheet resistance, typically in the range of 30 to 2000 ohms per square has been deposited on the upper surface of TEOS barrier layer 5, and a layer 9 of TiW has been formed and patterned on nichrome layer 6. After performing a photoresist procedure to define the locations of contact openings, such as contact opening 7, to expose electrodes/terminals of various other elements such as transistors and diffused resistors in region 4, such contact openings 7 have been etched through TEOS layer 5 and pre-metal dielectric layer 2 and a contact opening 10A has been etched through TEOS barrier layer 5 to expose a contact area of sichrome layer 3, as illustrated. Then a first metallization layer, referred to as the "Metal 1" layer, has been deposited on the exposed surface of the wafer and appropriately patterned to provide the structure including sections 12A, 12B and 12C as shown in FIG. 1.

Section 12A of Metal 1 layer fills contact opening 7, making good electrical contact to an electrode of a transistor or other element in region 4. Metal 1 section 12A also fills a SiCr resistor via opening 10A to electrically contact SiCr resistor 3. Metal 1 section 12B extends over most of the area of sichrome resistor 3 to form the upper plate of a back end capacitor, the lower plate of which is formed by sichrome layer 3, with TEOS barrier layer 5 between them to form the capacitor dielectric. Metal 1 section 12B also contacts one end of nichrome resistor 6, the other end of which is contacted by Metal 1 section 12C, as shown. The TiW material 9 provides improved electrical contact to the NiCr.

Back end capacitors of the type shown in FIG. 1 typically require a large amount of chip area. For state-of-the-art "deep submicron" technologies having 45-90 nanometer line widths in which trench isolation and dummy devices, CMP (chemical mechanical polishing), dummy fill to avoid "dishing", and a particular periodicity of back end thin film resistor lines are required, such back end capacitors may need to be made larger as the line widths get smaller because the back end capacitors may need to be constructed of multiple unit capacitor cells in order to be compatible with the minimum line widths and required periodicity.

Design engineers have endeavored to develop optimized back-end thin film resistor structures having various sheet resistances and TCRs (temperature coefficients of resistance) in single integrated circuits by controlling the thermal cycles to control the sheet resistances and TCRs of multiple back end thin film resistors formed on successive oxide layers.

"Poly-capacitors", including poly-oxide-metal and poly-oxide-poly capacitors are well-known in the art, but are not considered to be suitable as "back end" capacitors because they must be formed in conjunction with formation of the transistors and therefore "compete" with the transistors for unavailable chip area. (The term "poly" is used herein to refer to doped polycrystalline silicon.) Such poly capacitors have a number of shortcomings as a result of the characteristics of doped polycrystalline silicon layers, including relatively low capacitance per unit area because the oxide dielectric is usually relatively thick. Another shortcoming is that the voltage coefficients of poly capacitors may be variable as a function of the voltage between the capacitor plates.

In some cases it would be desirable to be able to provide back end capacitors in integrated circuits with already-formed integrated circuit substructures including transistors and/or other integrated circuit elements such as diffused resistors and/or polycrystalline silicon resistors. Also, it would be desirable to have a practical way of providing capacitors and resistors in integrated circuits which do not "compete" for chip area used for providing transistors, in contrast to use of conventional polycrystalline silicon resistors and capacitors which do compete for chip area used for providing transistors. Furthermore, it would be desirable to have a relatively simple manufacturing process which allows the option of providing one or more different kinds of back end capacitor structures having different characteristics within a single integrated circuit.

There is an unmet need for an improved integrated circuit structure and method for integrating one or more different kinds of back end capacitor structures into integrated circuits with already-formed integrated circuit substructures including transistors and/or other integrated circuit elements such as diffused resistors and/or polycrystalline resistors.

There also is an unmet need for an improved integrated circuit structure and method for integrating back end capacitors into integrated circuits with already-formed integrated circuit substructures including transistors and/or other integrated circuit elements such as diffused resistors and/or polycrystalline resistors using the same manufacturing process utilized for integrating back end thin film resistors into such integrated circuits.

There also is an unmet need for a practical way of providing capacitors and/or resistors in integrated circuits which do not "compete" for available chip area in which transistors can be formed.

SUMMARY

It is an object of the invention to provide a practical integrated circuit structure and method for integrating back end capacitors onto already-formed integrated circuit substructures including transistors and/or other integrated circuit elements such as diffused resistors and/or polycrystalline resistors.

It is another object of the invention to provide a practical integrated circuit structure and method for providing different thin film back end capacitors composed of the same or different materials of different sheet resistances onto a single integrated structure in which all of the thin film back end capacitors can be contacted by conductors of a single overlying interconnect metallization layer, wherein the interconnect metallization layer can be any interconnect metallization layer of the integrated circuit structure.

It is another object of the invention to provide an improved integrated circuit structure and method for integrating back end capacitors into integrated circuits with already-formed integrated circuit substructures including transistors and/or other integrated circuit elements such as diffused resistors and/or polycrystalline resistors using the same manufacturing process utilized for integrating back end thin film resistors into such integrated circuits.

It is another object of the invention to provide an improved integrated circuit structure and method for integrating one or more different kinds of back end capacitor structures into an integrated circuit with already-formed integrated circuit substructures including transistors and/or other integrated circuit elements such as diffused resistors and/or polycrystalline resistors.

It is another object of the invention to provide a practical way of providing capacitors and/or resistors in integrated circuits which do not "compete" for available chip area in which transistors can be formed.

Briefly described, and in accordance with one embodiment, the present invention provides an integrated circuit back end capacitor structure that includes a first dielectric layer (2) on a substrate, a thin film bottom plate (3-1) on the first dielectric layer, and a second dielectric layer (5) on the first dielectric layer and the bottom plate. A thin film top plate (15-1) is disposed on the second dielectric layer. The thin film top plate and bottom plate can be composed of different thin film resistive layers, such as sichrome, which also can be utilized to form back end thin film resistors having various properties. Interconnect conductors (12F,G) of a metallization layer (Metal 1) contact the top and bottom plates through corresponding vias in the dielectric layers.

In one embodiment, an integrated circuit back end capacitor structure includes a first dielectric layer (2), a bottom plate (3-1 or 15-1) disposed on the first dielectric layer (2), and composed of thin film resistive material of a first layer of thin film resistive material, a second dielectric layer (5 and/or 30) disposed on the first dielectric layer (2) and on the bottom plate (3-1 or 15-1), and a top plate (12E or 15-1) disposed on the second dielectric layer. A first interconnect conductor (12F or 12G) on the second dielectric layer (5 or 30) contacts a contact area of the bottom plate (3-1 or 15-1) through a corresponding via opening (10C or 20C). The top plate (12E or 15-1) can be composed of metal of a first metallization layer (Metal 1), or it can be composed of thin film resistive material of a second layer of thin film resistive material (15-1).

In one embodiment, the back end capacitor structure includes a back end thin film resistor (3 or 15) composed of one of a first back end thin film resistor (3) disposed on the first dielectric layer (2) and composed of thin film resistive material of the first layer of thin film resistive material and a second back end thin film resistor (15) disposed on the second dielectric layer (5) and composed of thin film resistive material of the second layer of thin film resistive material, the back end thin film resistor (3 or 15) contacting an interconnect conductor (12C) disposed on the second dielectric layer (5 or 30).

In one embodiment, the invention provides an integrated circuit back end capacitor structure (33D) including a first dielectric layer (2), a bottom plate (3-1) on the first dielectric layer (2), the bottom plate being composed of thin film resistive material of a first layer of thin film resistive material, a second dielectric layer (5) disposed on the bottom plate (3-1), a middle plate composed of thin film material of a second layer of thin film material (15-1) disposed on the second dielectric layer (5), a third dielectric layer (30) disposed on the middle plate (15-1) and contacting the bottom plate (3-1) through a corresponding via opening (10C), and a top plate (12E) disposed on the third dielectric layer (30), the top plate being composed of metal of a first metallization layer (Metal 1). An interconnect conductor (12G) composed of metal of the first metallization layer (Metal 1) contacts a contact area of the middle plate (3-1) through a corresponding via opening (20C).

An embodiment of the invention provides a method of making an integrated circuit including a back end capacitor by forming a first dielectric layer (2) on a semiconductor layer (1), forming a bottom plate (3-1 or 15-1) on the first dielectric layer (2), the bottom plate being composed of thin film resistive material of a first layer of thin film resistive material, forming a second dielectric layer (5 and/or 30) disposed on the first dielectric layer (2) and the bottom plate (3-1 or 15-1). A top plate (12E or 15-1) is formed on the second dielectric layer. A first interconnect conductor (12F) is formed of metal of a first metallization layer (Metal 1) on the second dielectric layer (5 or 30), the first interconnect conductor (12F) contacting a contact area of the bottom plate (3-1 or 15-1) through a corresponding via opening (10C or 20C) in the second dielectric layer (5 and/or 30). The top plate (15-1) can be formed of thin film resistive material of a second layer of thin film resistive material. A back end thin film resistor (3 or 15) can be formed of one of a first back end thin film resistor (3) on the first dielectric layer (2) and composed of thin film resistive material of the first layer of thin film resistive material and a second back end thin film resistor (15) disposed on the second dielectric layer (5) and composed of thin film resistive material of the second layer of thin film resistive material, the back end thin film resistor (3 or 15) contacting an interconnect conductor (12C) on the second dielectric layer (5 or 30).

BRIEF DESCRIPTION OF THE DRAWINGS

FIG. 1 is a section view diagram of the closest prior art.

FIGS. 2-9 schematically illustrate successive process steps involved in forming thin film back end capacitors of the present invention and also in forming back end thin film resistors.

DETAILED DESCRIPTION OF THE PREFERRED EMBODIMENTS

Figure 4:
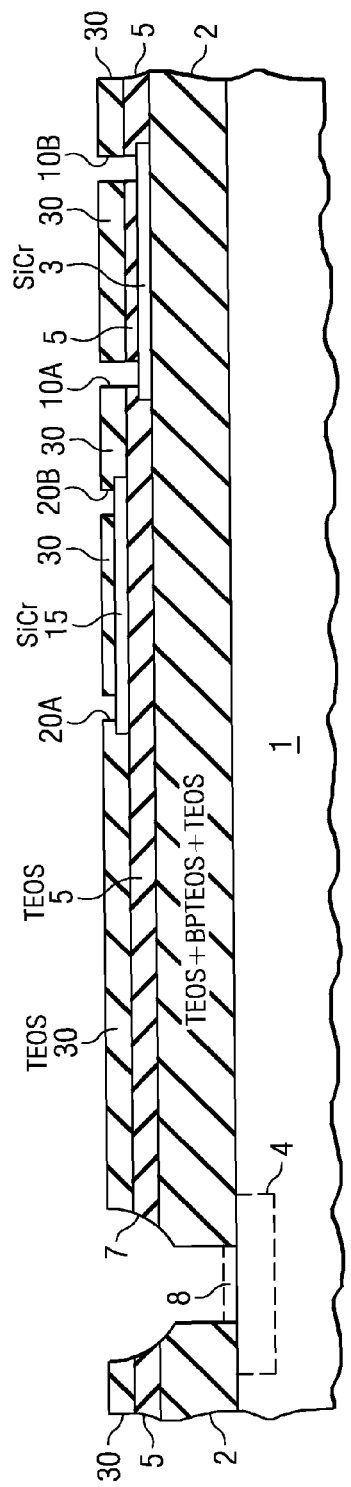

FIGS. 2-9 illustrate a sequence of the basic processing operations which can be used for integrating various kinds of "back end" thin film capacitors and/or various kinds of "back end" thin film resistors into a integrated circuit, wherein the thin film resistive materials can have the same or different sheet resistances and TCRs. The back end thin film capacitors and resistors can be interconnected by a single level of interconnect metallization.

Referring to FIG. 2, a starting silicon substrate 1 has a standard pre-metal dielectric layer 2 including a first TEOS (tetraethyl orthosilicate) sublayer on silicon substrate 1, a BPTEOS (Boron-Phosphorus TEOS) sublayer on the first TEOS sublayer, and a second TEOS layer on the BPTEOS sublayer. Typically, various active devices such as bipolar and/or MOS transistors have already been formed in region 4 of substrate 1.

A thin layer 3 of sichrome (SiCr) having a sheet resistance, typically in the range from 30 to 2000 ohms per square, has been deposited on the upper surface of pre-metal dielectric layer 2. If needed, an anneal process has been performed to adjust the TCR of SiCr layer 3 to a desired value, and a conventional photoresist deposition, etching, and cleaning process has been performed to pattern, i.e., define, the shape of SiCr resistor 3.

In FIG. 2, the first TEOS barrier layer 5 is formed on the upper surface of pre-metal dielectric layer 2 and SiCr resistor layer 3. The next step is to deposit and pattern a second SiCr layer 15 with a sheet resistance in the range of approximately 30-2000 ohms per square on the exposed surface of first TEOS barrier layer 5. For both sichrome layers 3 and 15, sheet resistances toward the lower end of the above ranges may be more suitable for making plates of thin film back end capacitors.

As shown in FIG. 3, a second TEOS barrier layer 30 is deposited on second sichrome layer 15 and first TEOS layer 5. After performing a photoresist procedure to define the locations of contact openings to expose terminals of various other elements formed in silicon substrate 1, such as transistors and diffused resistors in region 4, various contact openings 7 are etched through TEOS layers 5, 30 and pre-metal dielectric layer 2 as illustrated. (It should be appreciated that lower resistor 3 and/or upper resistor 15 could be composed of other thin film material, such as tantalum nitride or nichrome).

In FIG. 3, a vanadium layer may be formed on the exposed upper surface of the wafer, including the bottoms of contact openings 7. The wafer then is subjected to a suitable temperature to cause formation of vanadium silicide contact layers 8 at the bottoms of the contact openings 7. Unreacted vanadium is removed from the rest of the exposed wafer surface to produce the structure as illustrated in FIG. 3. (Note that palladium silicide, for example, could be formed instead of vanadium silicide.)

Referring to FIG. 4, a suitable photoresist operation and oxide etching procedure is performed next to define contact openings 10A and 10B in first TEOS barrier layer 5, and to define via openings 20A and 20B in second TEOS barrier layer 30 and first TEOS barrier layer 5 to expose contact areas of SiCr resistors 15 and 3, respectively, as shown. (An opening through a dielectric layer to allow subsequently deposited metallization to contact a silicon electrode is commonly referred to as a "contact opening", whereas an opening through a dielectric layer to contact another metal layer or a back end thin film resistor is commonly referred to as a "via opening". However, the term "contact opening" may encompass both types of openings.)

Figure 5:
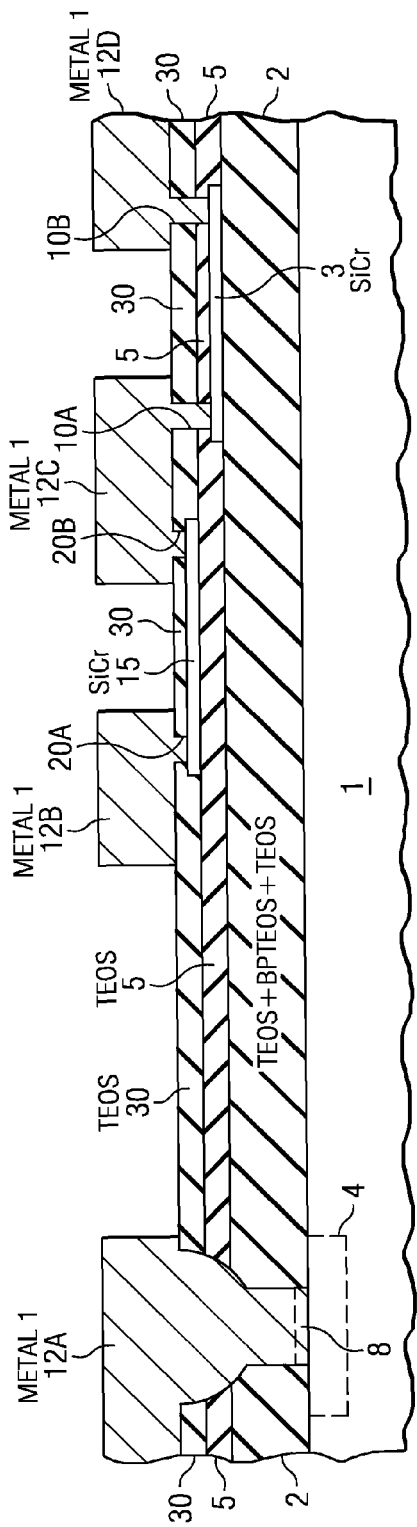

Referring to FIG. 5, a "Metal 1" metallization layer is deposited on the exposed surface of the wafer and patterned as shown. Section 12A of Metal 1 layer fills contact openings such as opening 7 to make electrical contact to electrodes/ terminals of various transistors, diffused resistors etc., that have been previously formed in region 4 of silicon substrate 1. Sections 12C and 12D of Metal 1 layer fill the SiCr resistor via openings 10A and 10B to electrically contact both terminals of SiCr resistor layer 3. Sections 12B and 12C fill the contact openings 20A and 20B to electrically contact both terminals of SiCr resistor 15. A suitable photoresist, metallization etching, and cleaning procedure results in the structure as shown in FIG. 5. The "Metal 1" layer, which can be composed of aluminum with 0.5% copper, is deposited and then patterned by conventional photolithography to define the sizes and shapes of various aluminum conductors.

Referring to FIG. 6, the next step is to deposit a TEOS layer 14, which includes a "TEOS liner" sublayer over the exposed wafer surface including the exposed oxide surface area and the Metal 1 surface area. Layer 14 also includes a FOx™ flowable oxide spin-on sublayer on the TEOS liner sublayer to achieve a suitable degree of planarization. An anneal in the presence of nitrogen gas is performed. Finally, layer 14 is completed by depositing a TEOS "cap" sublayer on the FOx™ flowable oxide spin-on sublayer layer. (FOx™ is a trademark applied to a flowable oxide composed of hydrogen silsesquioxane ($HSiO_{3/2}$) available from Dow Corning.)

Referring to FIG. 7, the next step is to perform a photoresist and etching procedure to pattern the locations and sizes of various via openings 18A and 18B extending down through layer 14 to expose surfaces of various Metal 1 sections such as sections 12A and 12B.

Figure 8:
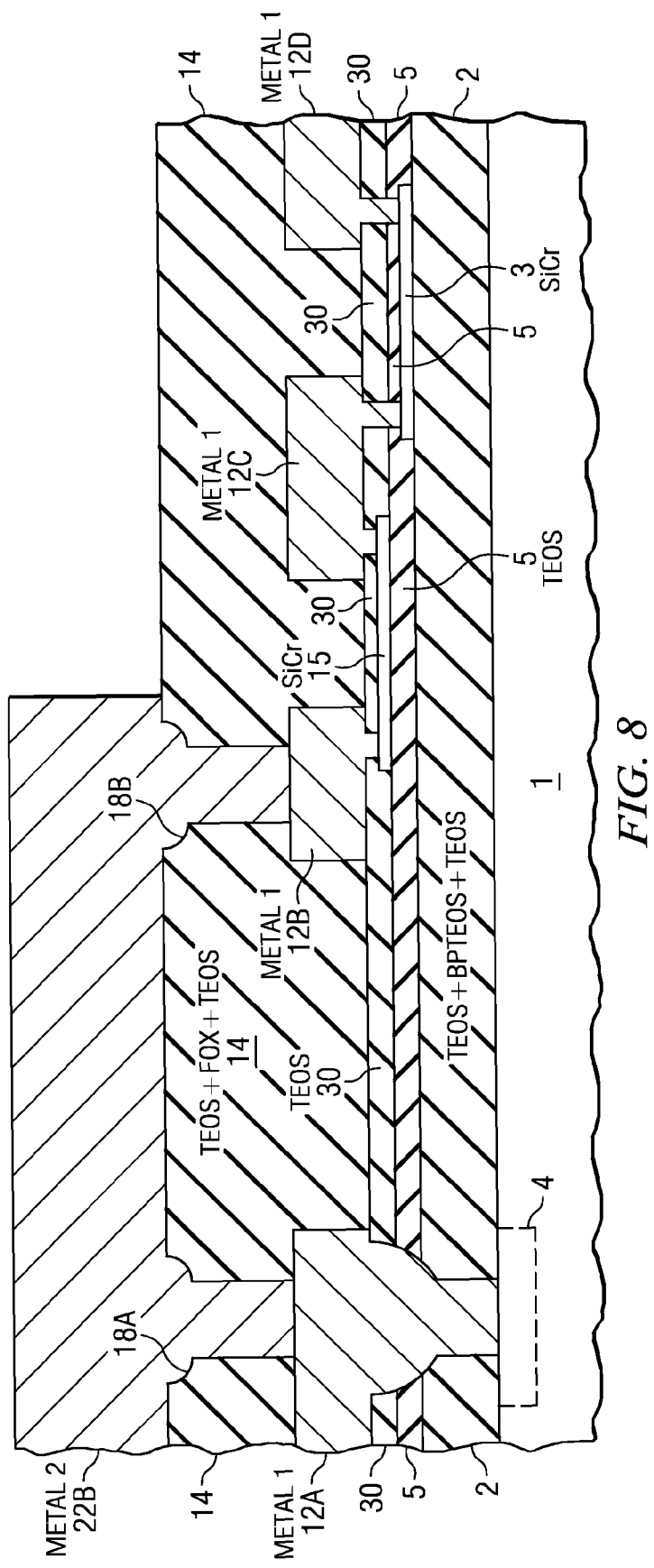

Next, as shown in FIG. 8, a second metallization "Metal 2" layer 22 is deposited on the exposed wafer surface, extending through the contact openings 18A and 18B to electrically contact the exposed surface areas of various Metal 1 conductors such as conductors 12A and 12B, respectively. After a photoresist and etching procedure, the various Metal 2 conductors such as conductor 22 are defined as shown generally in FIG. 8.

Figure 9:
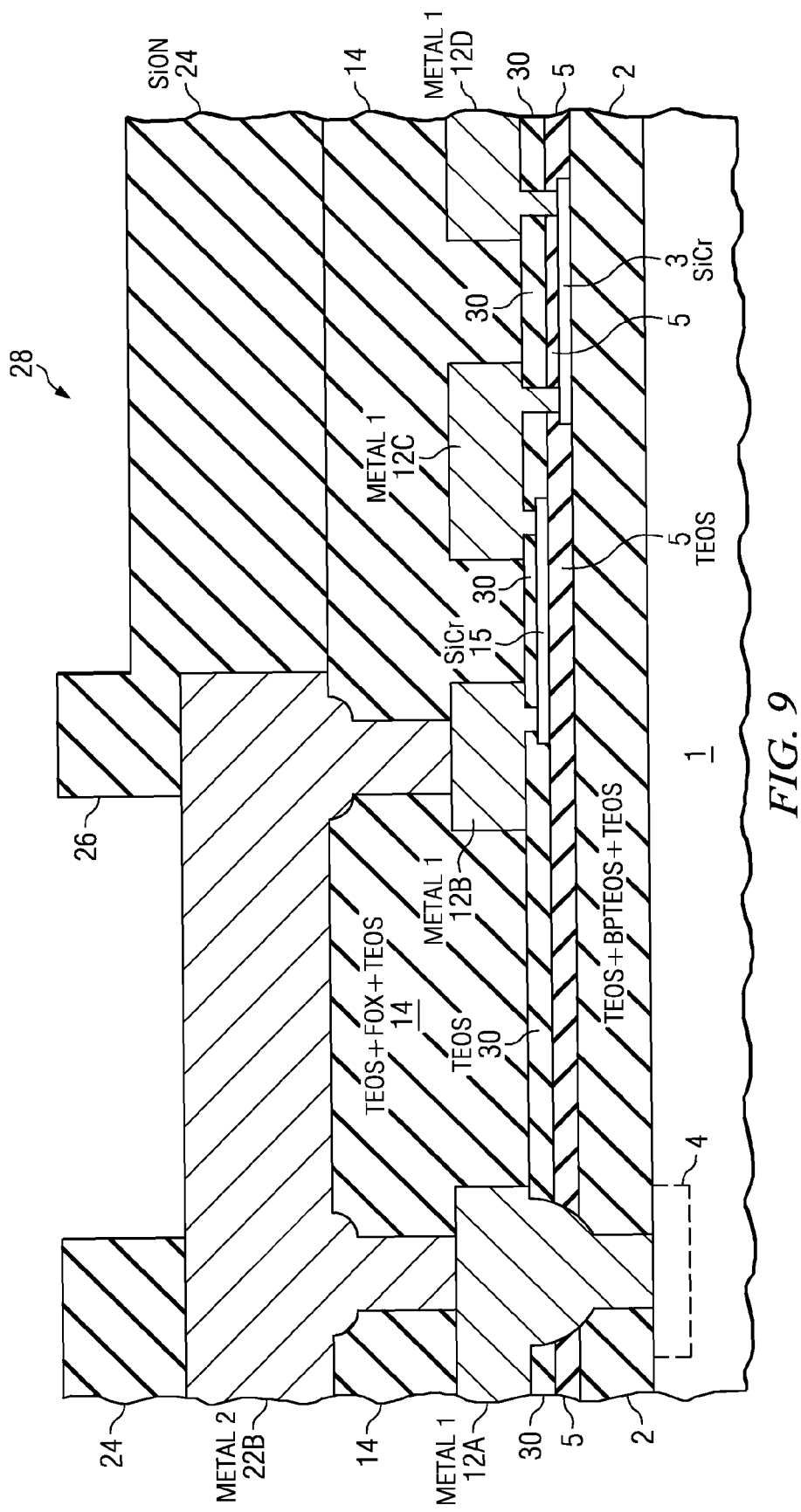

The next step is to form a protective passivation layer 24, which may be SiON (silicon oxynitride), followed by a photoresist and etching procedure to pattern bonding pad openings such as bonding pad opening 26. This results in the integrated circuit back end thin film resistor structure 28 as shown in FIG. 9.

FIGS. 10-13 illustrate four different back end thin film capacitors that can be formed using the same basic process steps described above with reference to FIGS. 2-9, wherein the various photomasks which pattern sichrome resistors 3 and 15 and the Metal 1 sections also are used to simultaneously pattern the corresponding lower capacitor plates and/ or upper capacitor plates. The various photomasks which pattern various contact and via openings in FIGS. 2-9 also simultaneously pattern corresponding contact and via openings to sichrome layers 3 and/or 15 and/or the Metal 1 layer so as to form electrical connections to the plates of the various back end thin film capacitors. In FIGS. 10-13 the lower SiCr layer 3-1 is referred to as the "SiCr(1) layer", and the upper SiCr layer 15-1 is referred to as the "SiCr(2) layer".

Figure 10:
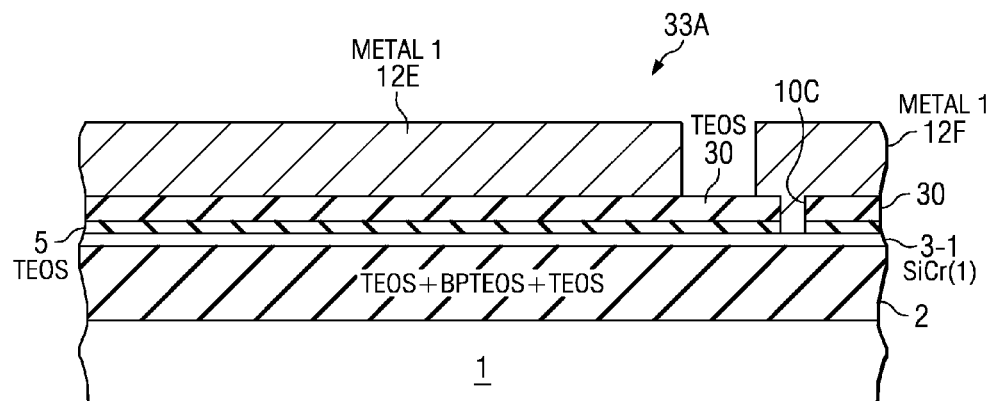
FIG. 10 is a section view diagram including a first back end capacitor according to the present invention.

FIG. 10 shows a back end thin film capacitor 33A, which can be referred to as a "Metal1-to-SiCr(1)" capacitor. Metal1-to-SiCr(1) capacitor 33A includes sichrome layer 3-1 as its lower plate, TEOS layers 5 and 30 as its dielectric, and Metal 1 section 12E as its upper plate. Metal 1 upper plate 12E is connected to appropriate circuitry of the same integrated circuit into which Metal1-to-SiCr(1) capacitor 33A is to be integrated. SiCr(1) lower plate 3-1 is connected through via opening 10C to Metal 1 section 12F, which also is connected to the appropriate circuitry of the integrated circuit. The dielectric thickness of Metal1-to-SiCr(1) capacitor typically is relatively large, so its capacitance per unit area is relatively low, but in some cases a circuit designer may find back end capacitor 33A to be particularly useful, especially where a high dielectric breakdown voltage is needed.

Figure 11:
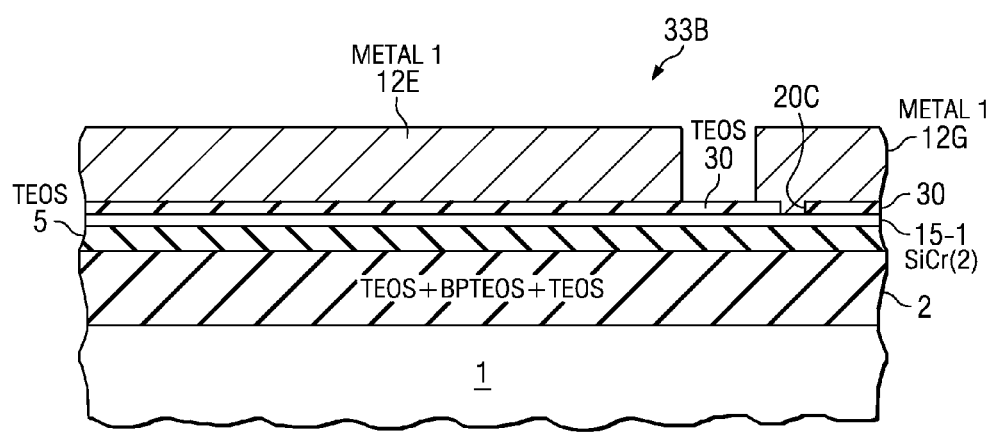
FIG. 11 is a section view diagram including a second back end capacitor according to the present invention.

FIG. 11 shows a back end thin film capacitor 33B, which can be referred to as a "Metal1-to-SiCr(2)" capacitor. Metal1-to-SiCr(2) capacitor 33B includes sichrome layer 15-1 as its lower plate, TEOS layer 30 as its dielectric, and Metal 1 section 12E as its upper plate. Metal 1 upper plate 12E is connected to appropriate circuitry of the same integrated circuit into which Metal1-to-SiCr(1) capacitor 33B is to be integrated. SiCr(2) lower plate 15-1 is connected through via opening 20C to Metal 1 section 12G, which also is connected to the appropriate circuitry of the integrated circuit. The dielectric thickness of Metal1-to-SiCr(2) capacitor 33B is somewhat less than capacitor 33A, so the capacitance per unit area of capacitor 33B is somewhat higher. Again, in some cases a circuit designer may find back end capacitor 33B to be particularly useful.

Figure 12:
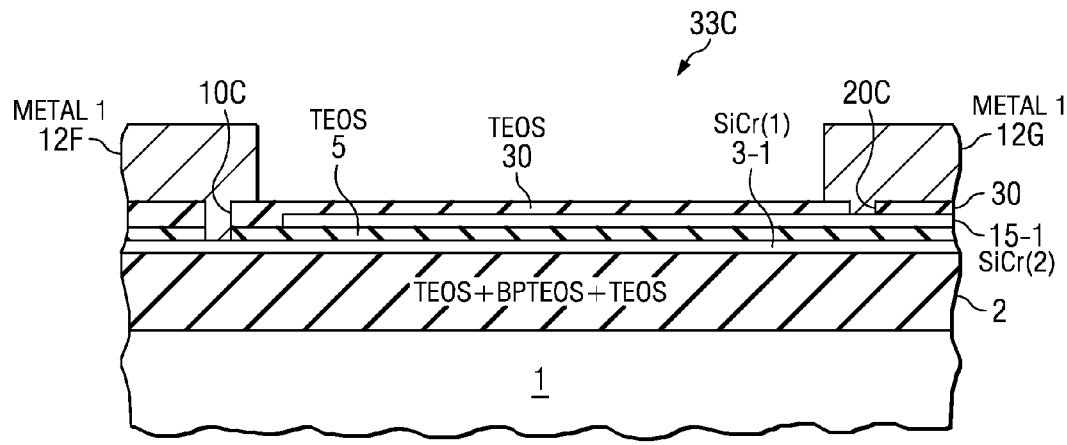
FIG. 12 is a section view diagram including a third back end capacitor according to the present invention.

FIG. 12 shows another back end thin film capacitor 33C, which can be referred to as a "SiCr(2)-to-SiCr(1)" capacitor, in which both plates are formed of thin film resistive material. SiCr(2)-to-SiCr(1) capacitor 33C includes lower sichrome layer 3-1 as its lower plate, TEOS layer 5 as its dielectric layer, and upper sichrome layer 15-1 as its upper plate. SiCr(2) upper plate 15-1 is connected to appropriate circuitry of the integrated circuit into which SiCr(2)-to-SiCr(1) capacitor 33C is to be integrated through via opening 20C by means of Metal 1 section 12G. SiCr(2) lower plate 3-1 is connected to the appropriate circuitry of the integrated circuit through via opening 10C to Metal 1 section 12F. The dielectric thickness of SiCr(2)-to-SiCr(1) capacitor 33C typically is much less than is the case for either of above described back end capacitors 33A and 33B, so the capacitance per unit area of capacitor 33C is much higher, although its dielectric breakdown voltage is lower. The thickness of the TEOS layers 5 and 30 which can be used as dielectrics in the above described back end capacitors can be in the range of approximately 300 to 2000 Angstroms, and it is quite practical at the present state-of-the-art to make the thickness of TEOS layer 5 as low as 300 Angstroms. Therefore, a circuit designer may find back end capacitor 33C to be particularly useful in many applications in which large capacitance values are needed and low breakdown voltage is acceptable.

Figure 13:
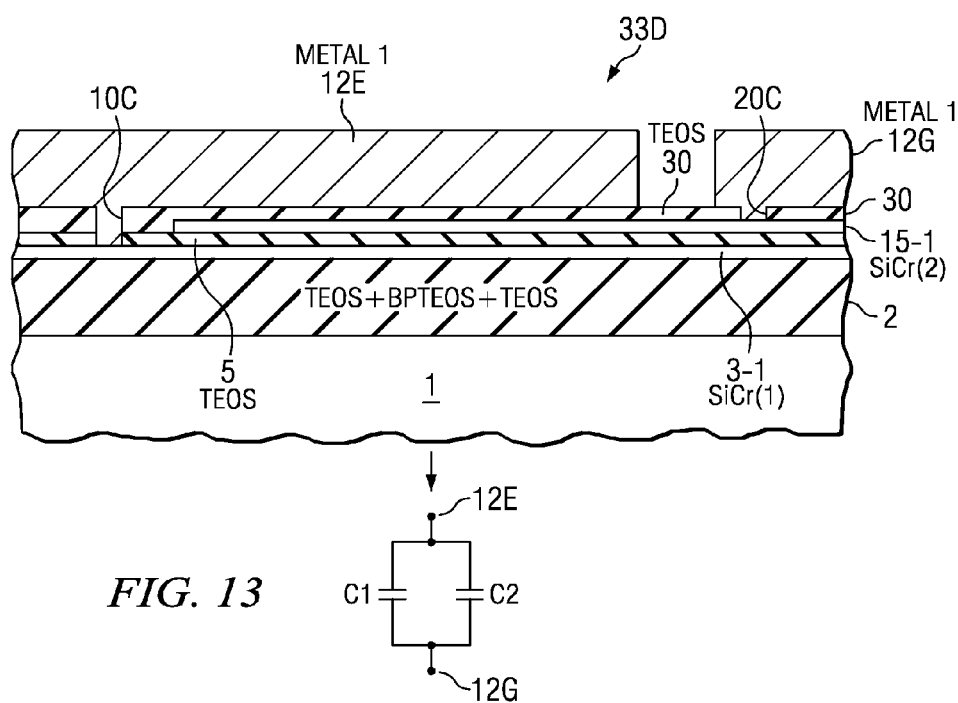
FIG. 13 is a section view diagram including a fourth back end capacitor according to the present invention.

FIG. 13 shows a back end thin film capacitor 33D, which can be referred to as a "Metal1-to-SiCr(2)-to-SiCr(1)" capacitor. Metal1-to-SiCr(2)-to-SiCr(1) capacitor 33D includes lower sichrome layer 3-1 as its lower plate, TEOS layer 5 as a lower dielectric layer, upper sichrome layer 15-1 as a "middle" plate, TEOS layer 30 as an upper dielectric layer, and Metal 1 section 12E as its upper plate. SiCr(2) plate 15-1 is connected through via opening 20C to Metal 1 section 12G. SiCr(1) plate 3-1 is connected through via opening 10C to Metal 1 section 12E. Thus, SiCr(2) plate 15-1 and Metal 1 section 12E form a first capacitor C1 which is connected in parallel with a second capacitor C2 as illustrated, wherein second capacitor C2 is formed by SiCr(1) layer 3-1 and SiCr(2) layer 15-1. The capacitance per unit area of composite capacitor 33D is higher than for any of the foregoing back end capacitors 33A-C, and for this reason circuit designers may find back end capacitor 33D to be particularly useful in some applications in which large capacitance is needed and lower breakdown voltages are acceptable.

Figure 14:
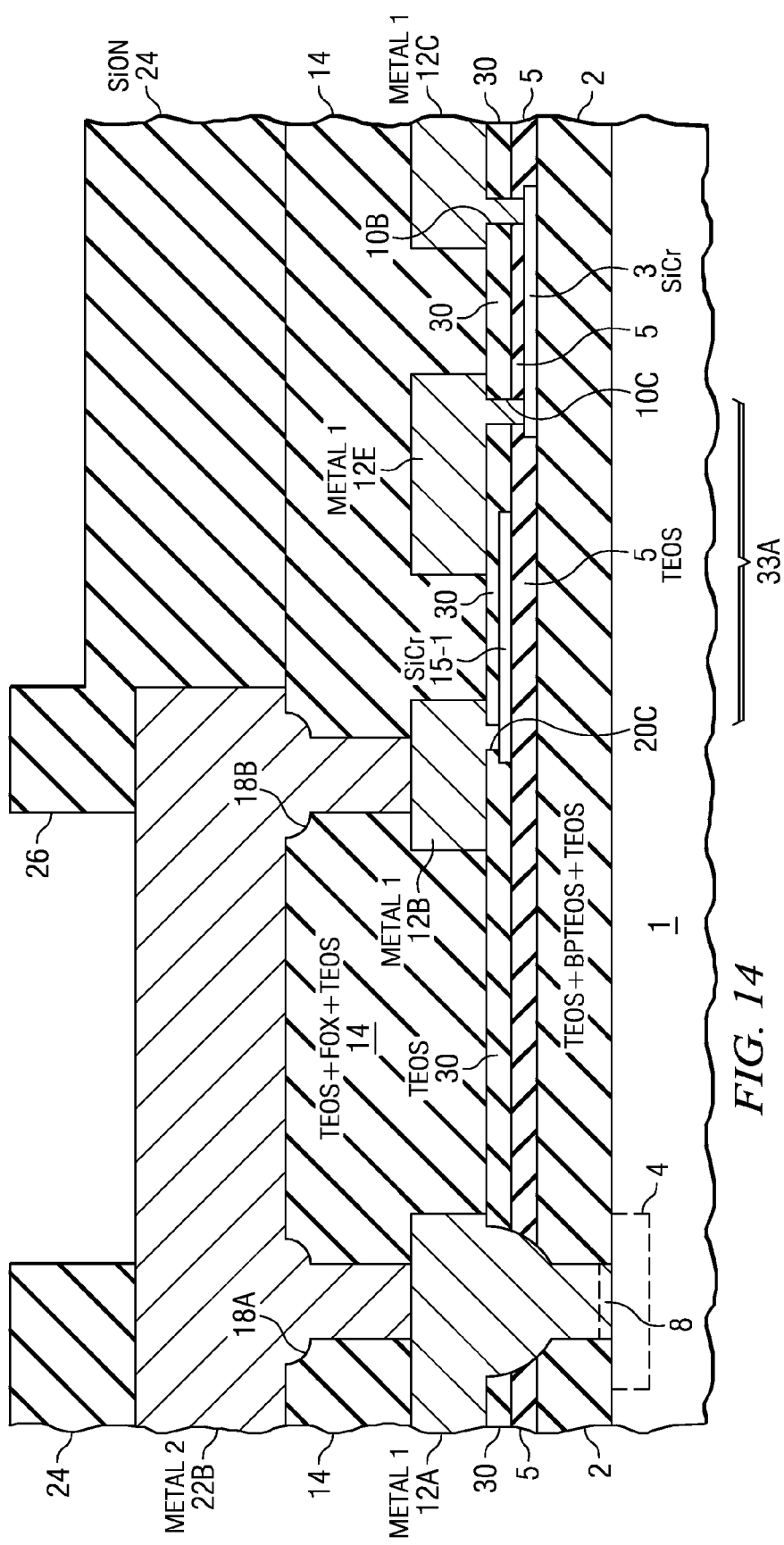
FIG. 14 is a section view of a back end thin film capacitor and a back end thin film resistor in a single integrated circuit structure.

Completion of the integrated circuit into which any (or all) of the back end capacitor structures shown in FIGS. 10-13 is (are) to be integrated can be achieved by forming oxide layer 14, contact openings 18A,B, Metal 2 layer, and oxide layer 24 in the manner described above with reference to FIGS. 2-9. For example, FIG. 14 shows an example of integrating both a SiCr(1) resistor layer 3 and the Metal1-to-SiCr(1) back end capacitor 33A of FIG. 10 in the same integrated circuit, using the process of FIGS. 2-9.

An advantage of the above described process is that it provides a substantial number of options to the circuit designer, including any and/or all of the four distinct capacitor structures shown in FIGS. 10-13, for providing stable, low-voltage-coefficient back end thin film capacitors with various breakdown voltages and various capacitances per unit area, in combination with either or both of two different kinds of back end thin film resistors which may have different sheet resistances and TCRs, on a single integrated circuit chip. Another advantage of the above process is that it can be easily modified so as to provide back end integration of the above described thin film capacitors and resistors at any level of metallization, i.e., directly connectable to any particular level of metallization. For example, the process could be easily modified to provide back end integration of the described thin film capacitors such that they are directly connectable to Metal 2 metallization rather than Metal 1 metallization. Another advantage to the back end thin film capacitors described herein is that they have substantially lower voltage coefficients than most other kinds of integrated circuit capacitor structures. This advantage is particularly important in manufacture of integrated circuit capacitor digital-to-analog converters (CDACs) and many or most integrated circuit analog-to-digital converters.

The foregoing thin film back end capacitors and thin film back end resistors can be readily formed using the described process in conjunction with advanced state-of-the-art integrated circuit manufacturing processes wherein CMP techniques are used to provide very uniform, planar surfaces and avoid appreciable "dishing". Therefore, the physical sizes which can be used for the back end capacitor plates and resistors are relatively independent of the CMP techniques and the SiCr(1) or SiCr(2) layers which function as the plates of the described back end capacitors can be of any suitable size.

It should be appreciated that above described processing and back end thin film capacitors and resistors can be used to provide stand-alone thin film resistor networks, thin film capacitor networks, and/or thin film RC networks and also to provide such networks integrated into other integrated circuits.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

For example, although various oxide layers are disclosed in the described embodiments, other dielectric layers, such as nitride layers, also can be used. As another example, the described structure could be modified by depositing nichrome (rather than sichrome) on intermetal dielectric layer 2. The back end thin film resistors and the back end capacitor plates could be composed various other kinds of thin film material.

What is claimed is:

1. A method of making an integrated circuit including a back end capacitor, the method comprising:
   forming a first dielectric layer over a semiconductor substrate including over an active device;
   forming and patterning a first layer of resistive material over the first dielectric layer;
   forming a second dielectric layer over the first dielectric layer and over the patterned first layer of resistive material;
   forming and patterning a second layer of resistive material over the second dielectric layer;
   forming a third dielectric layer over the second dielectric layer and over the patterned second layer of resistive material;
   selectively etching the third, second and first dielectric layers to provide at least one first contact opening down to the active device and a second contact opening down to a patterned lower plate region of one of the patterned first and second layers of resistive material;
   forming a first layer of conductive material over the third dielectric layer and within the at least one first and second contact openings; and
   patterning the first layer of conductive material to define first conductors for providing electrical contact to the active device through the at least one first contact opening, and to the patterned lower plate region through the second contact opening;
   whereby the steps are conducted so that a capacitor is formed having a lower plate defined by the patterned lower plate region and an upper plate defined by a patterned upper plate region of one of the patterned second layer of resistive material or the patterned first layer of conductive material.

2. The method of claim 1, further comprising:
   forming a fourth dielectric layer over the third dielectric layer and over the patterned first layer of conductive material;
   selectively etching the fourth dielectric layer to provide at least one third contact opening through the fourth dielectric layer down to at least one of the first conductors;
   forming a second layer of conductive material over the fourth dielectric layer and within the at least one third contact opening;
   patterning the second layer of conductive material to define at least one of second conductors for providing electrical contact to the at least one of the first conductors.

3. The method of claim 1, whereby the steps are further conducted so that a resistor is formed by a patterned resistor region of one of the patterned first and second layers of resistive material.

4. The method of claim 1, wherein the first and second layers of resistive material comprise first and second layers of sichrome.

5. The method of claim 4, wherein the first and second layers of sichrome have different sheet resistances.

6. The method of claim 1, wherein the first layer of resistive material is subjected to an anneal to adjust a temperature coefficient of resistance of the first layer of resistive material.

7. The method of claim 1, wherein the patterned lower plate region is a patterned lower plate region of the first layer of resistive material.

8. The method of claim 7, wherein the patterned upper plate region is a patterned upper plate region of the second layer of resistive material.

9. The method of claim 7, wherein the capacitor is formed having a lower plate defined by the patterned lower plate region of the first layer of resistive material, a middle plate defined by a patterned middle plate region of the second layer of resistive material, and the upper plate is defined by a patterned upper plate region of the patterned first layer of conductive material.

10. The method of claim 1, wherein the patterned upper plate regions is a patterned upper plate region of the patterned first layer of conductive material.

11. The method of claim 1, wherein the active device is a transistor; and further comprising forming a metal silicide at an upper surface of the semiconductor substrate exposed by the at least one first contact opening.

12. A method of making an integrated circuit including a back end capacitor, the method comprising:
   forming a first dielectric layer over a semiconductor substrate including over an active device;
   forming at least one patterned first resistive material region over the first dielectric layer by forming and patterning a first layer of resistive material over the first dielectric layer;
   forming a second dielectric layer over the first dielectric layer and over the at least one patterned first resistive material region;
   forming at least one patterned second resistive material region over the second dielectric layer by forming and patterning a second layer of resistive material over the second dielectric layer;
   forming a third dielectric layer over the second dielectric layer and over the at least one patterned second resistive material region;
   selectively etching to provide at least one first contact opening through the third dielectric layer down to the at least one patterned second resistive material region, at least one second contact opening through the third and second dielectric layers down to the at least one patterned first resistive material region, and at least one third contact opening through the third, second and first dielectric layers down to the active device;
   forming a first layer of conductive material over the third dielectric layer and within the at least one first contact opening, the at least one second contact opening, and the at least one third contact opening; and
   patterning the first layer of conductive material to form patterned first conductive material regions to define at least one first conductor for providing electrical contact to the at least one patterned second resistive material region, to the at least one patterned first resistive material region, and to the active device;
   whereby the steps are conducted so that a capacitor is formed having a lower plate defined by the at least one patterned first resistive material region and an upper plate defined by one of the at least one patterned second resistive material region or one of the patterned first conductive material regions.

13. The method of claim 12, whereby the steps are conducted so that the capacitor is formed having the upper plate defined by one of the patterned first conductive material regions, and further having a middle plate defined by the at least one patterned second resistive material region.

14. The method of claim 12, wherein one of the at least one patterned first resistive material regions or the at least one patterned second resistive material regions includes at least one patterned resistor region; and whereby the steps are further conducted so that a resistor is formed by the at least one patterned resistor region.

15. The method of claim 12, further comprising:
forming a fourth dielectric layer over the third dielectric layer and over the patterned first layer of conductive material;
selectively etching the fourth dielectric layer to provide at least one fourth contact opening through the fourth dielectric layer down to the at least one first conductor;
forming a second layer of conductive material over the fourth dielectric layer and within the at least one fourth contact opening;
patterning the second layer of conductive material to form patterned second conductive material regions to define at least one second conductor for providing electrical contact to the at least one first conductor;
forming a fifth dielectric layer over the fourth dielectric layer and over the patterned second layer of conductive material; and
selectively etching the fifth dielectric layer to provide at least one bond pad opening.

16. The method of claim 15, wherein the first and second layers of resistive material comprise first and second layers of sichrome having different sheet resistances.

17. The method of claim 16, further comprising subjecting the first layer sichrome material to an anneal to adjust the temperature coefficient of resistance of the first layer of sichrome material.

18. A method of making an integrated circuit including a back end capacitor, the method comprising:
forming a first dielectric layer over a semiconductor substrate including over an active device;
forming a bottom plate over the first dielectric layer by patterning a first layer of sichrome material deposited over the first dielectric layer;
forming a second dielectric layer over the first dielectric layer and over the bottom plate;
forming a top plate over the second dielectric layer by patterning a second layer of sichrome material deposited over the second dielectric layer;
forming a third dielectric layer over the second dielectric layer and over the top plate;
selectively etching to provide at least one first contact opening through the third dielectric layer down to the top plate, at least one second contact opening through the third and second dielectric layers down to the bottom plate, and at least one third contact opening through the third, second and first dielectric layers down to the active device;
forming a first layer of conductive material over the third dielectric layer and within the at least one first contact opening, the at least one second contact opening, and the at least one third contact opening;
patterning the first layer of conductive material to define first conductors for providing electrical contact to the top plate, to the bottom plate, and to the active device;
forming a fourth dielectric layer over the third dielectric layer and over the patterned first layer of conductive material;
selectively etching the fourth dielectric layer to provide fourth contact openings through the fourth dielectric layer down to at least some of the first conductors;
forming a second layer of conductive material over the fourth dielectric layer and within the fourth contact openings;
patterning the second layer of conductive material to define second conductors for providing electrical contact to the at least some of the first conductors;
forming a fifth dielectric layer over the fourth dielectric layer and over the patterned second layer of conductive material; and
selectively etching the fifth dielectric layer to provide a bond pad opening;
wherein the steps are conducted so that a capacitor is formed having the bottom plate as a first capacitor plate, the second dielectric layers as a first capacitor dielectric, and the top plate as a second capacitor plate.

19. The method of claim 18, wherein the steps are further conducted so that the capacitor is formed having the third dielectric layer as a second capacitor dielectric, and a patterned region of the first layer of conductive material as a capacitor third plate.

20. The method of claim 18, wherein the steps are further conducted so that at least one of the first or second layers of sichrome material also provides a resistor.

* * * * *